United States Patent [19]

Yamazaki

[11] 4,320,248
[45] Mar. 16, 1982

[54] SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 177,407

[22] Filed: Aug. 12, 1980

[30] Foreign Application Priority Data

Aug. 13, 1979 [JP] Japan .............................. 54/102905
Aug. 13, 1979 [JP] Japan .............................. 54/102906

[51] Int. Cl.³ ..................................... H01L 31/06
[52] U.S. Cl. ................................. 136/255; 136/256; 136/258; 357/30
[58] Field of Search ................ 136/255, 256, 258; 357/15, 30

[56] References Cited

U.S. PATENT DOCUMENTS 3,549,411 12/1970 Bean et al. ............................ 427/94
4,117,506 9/1978 Carlson et al. ....................... 357/30
4,167,015 9/1979 Hanak .................................. 357/16

OTHER PUBLICATIONS

E. J. Charlson et al., "An MIS Photovoltaic Cell with Silicon Nitride Insulator", *Conf. Record, 13th IEEE Photovoltaic Specialists Conf.*, 1978, pp. 656–660.

*Primary Examiner*—Aaron Weisstuch
*Attorney, Agent, or Firm*—Gerald J. Ferguson, Jr.; Joseph J. Baker

[57] ABSTRACT

An MIS type semiconductor photoelectric conversion device which comprises a semiconductor layer, a light-transparent, current-permeable, insulating or semi-insulating layer disposed on the semiconductor layer, a first conductive layer disposed on the light-transparent, current-permeable, insulating or semi-insulating layer, and a second conductive layer disposed on the semiconductor layer on the opposite side from the light-transparent, current-permeable, insulating or semi-insulating layer, and in which when light is incident to the semiconductor layer from the outside of the first conductive layer, a photoelectric conversion function is obtained by the presence of a barrier set up by the light-transparent, current-permeable, insulating or semi-insulating layer.

In such an MIS type semiconductor photoelectric conversion device, the light-transparent, current-permeable, insulating or semi-insulating layer is formed of a nitride. The nitride layer is formed of silicon nitride or silicon nitride and a conductive metal nitride. In the MIS type semiconductor photoelectric conversion device, the first conductive layer has a comb- or grid-like pattern and an anti-reflection layer is formed to cover the first conductive layer. The light-transparent, current-permeable, insulating or semi-insulating layer and the anti-reflecting layer are both formed of a nitride.

3 Claims, 3 Drawing Figures

SEMICONDUCTOR PHOTOELECTRIC CONVERSION DEVICE

BACKGROUND OF THE INVENTION

1. Field of the Invention

This invention relates to an MIS type semiconductor photoelectric conversion device which is of particular utility when employed in a solar battery.

2. Description of the Prior Art

An MIS type semiconductor photoelectric conversion device is, in principle, provided with a semiconductor layer, a light-transparent, current-permeable, insulating or semi-insulating layer deposited on the semiconductor layer, a first conductive layer deposited on the light-transparent, current-permeable, insulating or semi-insulating layer, and a second conductive layer deposited on the semiconductor layer on the opposite side from the light-transparent, current-permeable, insulating or semi-insulating layer; and the MIS type semiconductor photoelectric conversion device is arranged so that when light is incident to the semiconductor layer from the outside of the first conductive layer, a photoelectric conversion function is provided by the presence of a barrier which is set up by the light-transparent, current-permeable, insulating or semi-insulating layer.

In such a conventional MIS type semiconductor photoelectric conversion device, the light-transparent, current-permeable, insulating or semi-insulating layer is usually formed of an oxide of the semiconductor making up the semiconductor layer. Since the semiconductor layer is usually formed of silicon, the light-transparent, current-permeable, insulating or semi-insulating layer is formed of a silicon oxide.

Such a light-transparent, current-permeable, insulating or semi-insulating layer has active oxygen, and is unstable chemically. Accordingly, this layer, when heated, is liable to chemically react with the semiconductor layer, the first conductive layer and an undesirable impurity from the outside.

Accordingly, the conventional MIS type photoelectric conversion device has the defect that when it is exposed to high temperature for a long time, the thickness and height of the barrier set up by the light-transparent, current-permeable, insulating or semi-insulating layer varies, resulting in a degraded photoelectric conversion characteristic and lowered photoelectric conversion efficiency.

In general, the oxide layer has a large energy band gap and when the oxide layer is a silicon oxide layer, the energy band gap is as large as 8 eV.

Consequently, even if the light-transparent, current-permeable, insulating or semi-insulating oxide layer in the conventional MIS type semiconductor photoelectric conversion device is so thin that a current may pass through the layer, the layer itself does not readily permit the passage therethrough of a current and has a high resistance.

Accordingly, the prior art MIS type semiconductor photoelectric conversion device has the defects of a poor photoelectric conversion characteristic and very low photoelectric conversion efficiency.

Furthermore, in the conventional MIS type semiconductor photoelectric conversion device, even if the light-transparent, current-permeable, insulating or semi-insulating layer is interposed between the semiconductor layer and the first conductive layer, the interposed layer is an oxide layer and hence is likely to pass an undesirable impurity from the interposed layer itself or the first conductive layer or the outside thereof to the semiconductor layer and useful impurity introduced in the semiconductor layer to the interposed layer.

As a consequence, the conventional MIS type semiconductor photoelectric conversion device is defective in that in a long term use, the photoelectric conversion characteristic is deteriorated and, in particular, the photoelectric conversion efficiency is lowered.

Moreover, since the light-transparent, current-permeable, insulating or semi-insulating layer interposed between the semiconductor layer and the first conductive layer is formed of a chemically unstable oxide, there is the possibility of the layer being formed so thick as not to permit the passage therethrough of current.

Accordingly, the prior art MIS type semiconductor photoelectric conversion device has the drawback that it is difficult to obtain an excellent photoelectric conversion characteristic and a high photoelectric conversion efficiency.

SUMMARY OF THE INVENTION

Accordingly, it is an object of the present invention to provide a novel MIS type semiconductor photoelectric conversion device which is free from the abovesaid shortcomings of the prior art.

In the MIS type semiconductor photoelectric conversion device according to the present invention, a light-transparent, current-permeable, insulating or semi-insulating layer is interposed between a semiconductor layer and a first conductive layer, as is the case with the prior art, but the light-transparent, current-permeable, insulating or semi-insulating layer is not an oxide layer but a nitride layer.

The abovesaid light-transparent, current-permeable insulating or semi-insulating nitride layer has no active oxygen, and hence is very stable chemically. Therefore, the nitride layer, even if heated, does not readily react chemically with the semiconductor layer, the first conductive layer and an undesirable impurity from the outside.

Accordingly, an MIS type semiconductor photoelectric conversion device of the present invention has the advantage that even if it is placed in a high temperature condition for many hours, the thickness and height of the barrier set up by the light-transparent, current-permeable, insulating or semi-insulating layer hardly vary, and consequently the photoelectric conversion characteristic and the photoelectric conversion efficiency are hardly degraded.

In general, a layer formed of a nitride has a smaller energy band gap than that of an oxide layer.

Therefore, the abovesaid light-transparent, current-permeable, insulating or semi-insulating layer readily passes current therethrough and has a low resistance as compared with an oxide layer.

Accordingly, the MIS type semiconductor photoelectric conversion device of the present invention has an excellent photoelectric conversion characteristic and is far higher in photoelectric conversion efficiency as compared with the prior art MIS type semiconductor photoelectric conversion device described previously.

Moreover, the abovesaid light-transparent, current-permeable, insulating or semi-insulating layer substantially inhibits the passage therethrough of an undesirable impurity from that layer itself or the first conductive layer or the outside thereof to the semiconductor layer and useful impurity introduced in the semiconductor layer to that layer itself.

Accordingly, the MIS type semiconductor photoelectric conversion device of the present invention has the advantage that even after it is used for a long time, the photoelectric conversion characteristic and the photoelectric conversion efficiency are hardly deteriorated.

Furthermore, the light-transparent, current-permeable, insulating or semi-insulating layer is formed of a nitride, and hence is stable chemically; accordingly, the layer can easily be formed to be current-permeable.

Accordingly, the MIS type semiconductor photoelectric conversion device of the present invention can easily be manufactured to have a predetermined photoelectric conversion characteristic and high photoelectric conversion efficiency.

Other objects, features and advantages of the present invention will become apparent from the following description taken in conjunction with the accompanying drawings.

DESCRIPTION OF THE PREFERRED EMBODIMENTS

Figure 1:
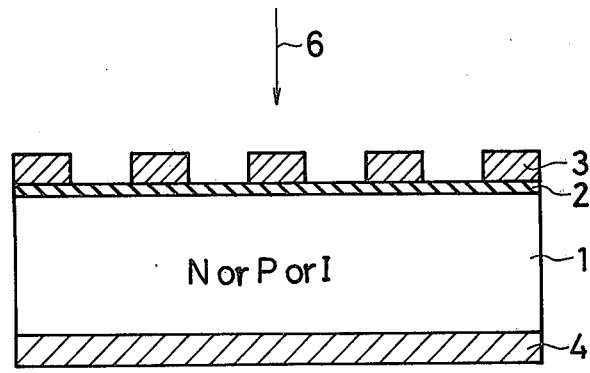
FIG. 1 is a schematic sectional view illustrating an embodiment of the MIS type semiconductor photoelectric conversion device of the present invention.

FIG. 1 illustrates in section an embodiment of the MIS type semiconductor photoelectric conversion device of the present invention, which has a semiconductor layer 1. The semiconductor layer 1 may be an N or P type or an intrinsic (I type) semiconductor layer.

The semiconductor layer 1 can be formed of a single crystal semiconductor, in particular, single crystal silicon but may also be a layer which is made, by a known plasma CVD method, glow discharge method, low-pressure CVD method or the like, of a non-single-crystal semiconductor such as an amorphous semiconductor, a polycrystalline semiconductor or the like, especially, non-single-crystal silicon such as amorphous silicon, polycrystalline silicon or the like. Further, the semiconductor layer 1 may also be a layer of the above-said non-single-crystal semiconductor, in particular, non-single-crystal silicon, which is partially or wholly annealed by irradiation, for example, by laser light, into single crystal. The latter is preferred since the carrier mobility is 10 to $10^3$ times as high as in the case of the former.

On the semiconductor layer 1 is formed a light-transparent, current-permeable, insulating or semi-insulating layer 2.

This insulating or semi-insulating layer 2 is formed thin enough to permit the passage therethrough of current; for example, this layer can be 5 to 100 Å thick. The insulating or semi-insulating layer 2 may be formed as a silicon nitride layer. Such a silicon nitride layer 2 can be formed by nitrifying the surface of the semiconductor layer 1 by a thermal nitriding treatment in a nitrogen atmosphere, or by depositing a silicon nitride on the surface of the semiconductor layer 1, using a known vapor growth method. Further, the insulating or semi-insulating nitride layer 2 can be formed of a mixture or compound of a silicon nitride and a conductive metal nitride. The metal nitride may be one selected from a group consisting of titanium nitride, tantalum nitride, tungsten nitride and chromium nitride, or a mixture or compound of two or more kinds of them. The layer 2 made of the mixture or compound of the silicon nitride and the metal nitride can be formed by depositing the mixture or compound of a silicon nitride and a metal nitride, using a known vapor growth method. Further, the light-transparent, current-permeable, insulating or semi-insulating layer 2 may also be formed by introducing into the abovesaid silicon nitride layer or the layer made of the silicon nitride and the metal oxide, in an amount of 0.1 to 10% relative to the silicon nitride or the silicon nitride and the metal nitride, a conductive material which is selected from a group consisting of tantalum, tungsten, molybdenum, zirconium, titanium, vanadium, chromium, lead, nickel, tin and germanium, or a mixture or compound of two or more kinds of them. A conductive layer 3 is formed on the insulating or semi-insulating nitride layer 2 on the semiconductor layer 1.

This conductive layer 3 is a conductive material layer which provides a work function difference between it and the semiconductor layer 1. In this case where the semiconductor layer 1 is made of an N type or intrinsic semiconductor, it is preferred that the conductive layer 3 is a conductive material layer which has a larger work function than the semiconductor layer 1. The conductor material may be one or more materials selected from a group consisting of platinum, gold, molybdenum and tungsten. In the case where the semiconductor layer 1 is a P type or intrinsic semiconductor layer, it is preferred that the conductive layer 3 is a conductive material layer which has a smaller work function than the semiconductor layer 1, and the conductive material may be aluminum or magnesium.

The conductive layer 3 can be formed over the entire area of the insulating or semi-insulating layer 2, but it is preferred that the layer 3 is formed in such a comb- or grid-like pattern as shown. In the case where the conductive layer 3 has such a comb- or grid-like pattern, the layer 3 need not be light-transparent and may be thick. In this case, however, the comb- or grid-like pattern must have such a pitch that a depletion layer based on the work function difference between the semiconductor layer 1 and the conductive layer 3 may be formed throughout the region of the semiconductor layer 1 on the side of the insulating or semi-insulating layer 2. The conductive layer 3 can be deposited by a known vacuum evaporation or sputtering method. The fact that the conductive layer 3 can be formed thick because of its comb- or grid-like pattern means that it can easily be formed.

Deposited over the entire area of the surface of the semiconductor layer 1 on the opposite side from the insulating or semi-insulating layer 2 is the conductive layer 4 which is a counterpart of the conductive layer 3. In this case, it is also possible to interpose between the semiconductor layer 1 and the conductive layer 4 a current-permeable nitride layer. However, the conductive layer 4 can be deposited directly on the semiconductor layer 1 to make ohmic contact therewith, as shown. The conductive layer 4 may be made of an arbitrary material; for example, the layer 4 can be formed as an aluminum layer made by vacuum evaporation. In the case of depositing the conductive layer 4 directly on the semiconductor layer 1, the semiconductor layer 1 can be formed, by the CVD method, of a polycrystalline semiconductor doped with a large quantity of an N or P type impurity as a conductive material, depending on whether the semiconductor layer 1 is N, P or I type.

Figure 2:
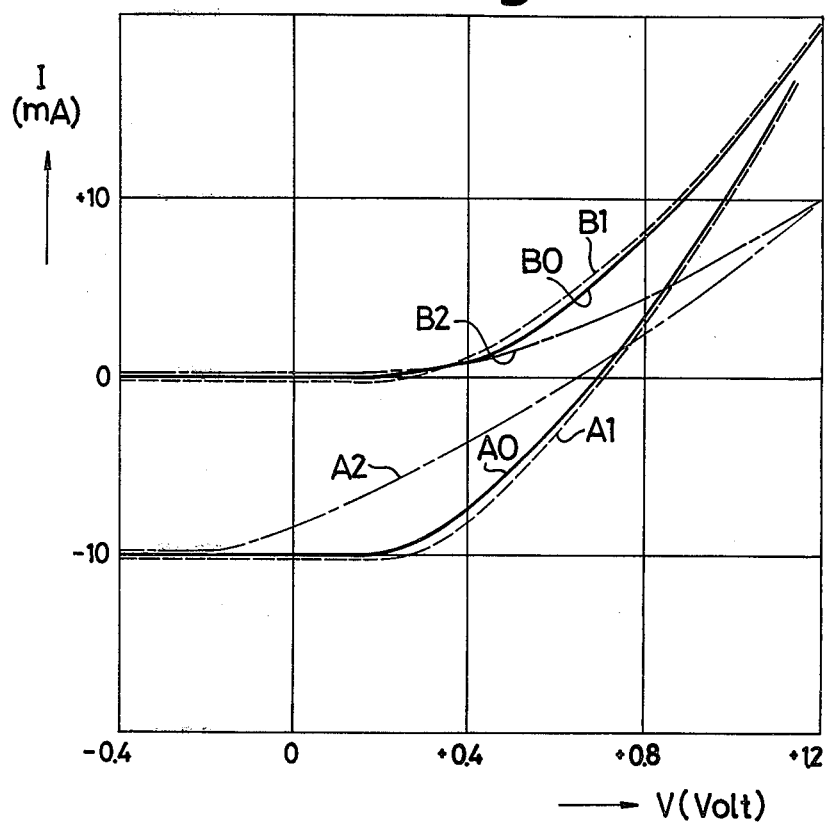
FIG. 2 is a V-I characteristic graph explanatory of the embodiment shown in FIG. 1.

The above is a description of an embodiment of the MIS type semiconductor photoelectric conversion device of the present invention. Since the above embodiment bears an apparent resemblance to the conventional MIS type semiconductor photoelectric conversion device, the photoelectric conversion function can be obtained with the same mechanism as in the prior art. The mechanism, though not described in detail, is as follows: When light is incident to the semiconductor layer 1 through the light-transparent, current-permeable, insulating or semi-insulating layer 2 from the outside of the transparent substrate 1, as indicated by the arrow 6, carriers generated by the incident light are produced in a depletion layer formed in the conductor layer 1 mainly on the side of the insulating or semi-insulating layer 2 and either electrons or holes comprising the carriers reach the conductive layer 3 through the insulating or semi-insulating layer 2 and the other carrier type reaches the conductive layer 4. By this mechanism, there can be obtained such a photoelectric conversion function that a current corresponding to the intensity of the incident light flows via the conductive layers 3 and 4. Now, considering the photoelectric conversion function in view of the relationship of current I (milliampere (mA)) flowing through the conductive layers 3 and 4 with respect to voltage V (volt (V)) applied to the conductive layers 3 and 4, that is, in the light of the V-I characteristic, the dark characteristic in the absence of the light 6 can be obtained, as indicated by curve AO in FIG. 2, and when the light 6 is incident with an intensity of AM 1 ( the intensity of the sunlight on the equator, about 100 milliwatts/cm$^2$), the V-I characteristic can be obtained as shown by curve B0 in FIG. 2.

In the MIS type semiconductor photoelectric conversion device of the present invention, shown in FIG. 1, however, the light-transparent, current-permeable, insulating or semi-insulating layer 2 interposed between the semiconductor layer 1 and the conductive layer 3 is formed of a nitride. The insulating or semi-insulating layer 2 has no active oxygen, and hence is very stable chemically.

Accordingly, for the reasons set forth in "Summary of the Invention," the MIS type semiconductor photoelectric conversion device of FIG. 1 exhibits the advantage that even if it is exposed to high temperature for many hours, the thickness and height of the barrier set up by the insulating or semi-insulating layer 2 hardly vary, holding the photoelectric conversion characteristic and the photoelectric conversion efficiency substantially unchanged. This has been ascertained by my experiments in which after the MIS type semiconductor photoelectric conversion device of FIG. 1 was exposed to as high a temperature as 150° C. for as long a time as 1000 hours, the same V-I characteristic was obtained as when the curves AO and B0 were obtained as shown by curves A1 and B1 in FIG. 2 which are substantially the same as the curves AO and B0. Incidentally, a similar experiment was also conducted on a semiconductor photoelectric conversion device which was identical in construction with the embodiment of FIG. 1 except that the light-transparent, current-permeable, insulating or semi-insulating layer 2 was an oxide layer which had the V-I characteristic as shown by the curves AO and B0 in FIG. 2. After the semiconductor photoelectric conversion device was similarly exposed to the high temperature of 150° C. for 1000 hours, the same V-I characteristic as when the curves AO and B0 were obtained was measured. The V-I characteristic thus measured is shown by curves A2 and B2 which greatly differ from the curves AO and B0; namely, the V-I characteristic is very poor as compared with the V-I characteristic of the device of the present invention.

In the embodiment of FIG. 1, the light-transparent, current-permeable, insulating or semi-insulating layer 2 was a nitride layer, and hence has a small energy band gap as compared with an oxide layer. In other words, the insulating or semi-insulating layer 2 readily passes current therethrough and has a low resistance.

As a result of that, the embodiment of FIG. 1 has a photoelectric conversion efficiency 20 to 40% higher than that obtainable with the conventional MIS type semiconductor conversion device. This is especially so in the case where the insulating or semi-insulating layer 2 includes a conductive metal nitride or a conductive material.

Furthermore, since the light-transparent, current-permeable, insulating or semi-insulating layer 2 in the embodiment of FIG. 1 is a nitride layer, the layer 2 substantially inhibits the passage therethrough of an undesirable impurity from the layer 2 itself or the conductive layer 3 or the outside thereof to the semiconductor layer 1 and of an effective impurity introduced in the semiconductor layer 1 to the insulating or semi-insulating layer 2.

Accordingly, the embodiment of FIG. 1 is advantageous in that even after it is used for a long period of time, the photoelectric conversion characteristic is hardly deteriorated and the photoelectric conversion efficiency is hardly lowered.

Moreover, the insulating or semi-insulating layer 2 is formed artificially; namely, in the course of its formation, an oxide layer which would otherwise be formed on the surface of the semiconductor layer 1 is prevented substantially, and the layer 2 is very stable chemically. Therefore, the layer 3 can easily be formed to be current-permeable.

Accordingly, the embodiment of FIG. 1 can easily be fabricated to have a predetermined photoelectric conversion characteristic and high photoelectric conversion efficiency.

Figure 3:
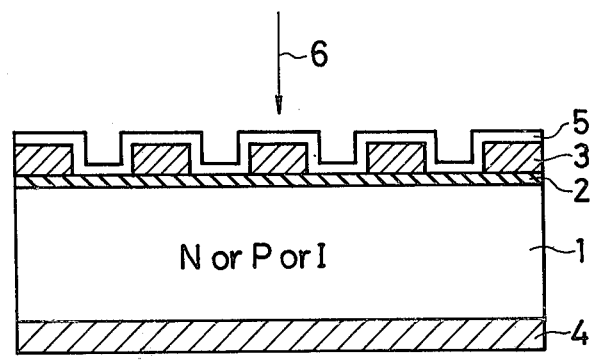
FIG. 3 is a schematic sectional view illustrating another embodiment of the MIS type semiconductor photoelectric conversion device of the present invention.

FIG. 3 illustrates another embodiment of the MIS type semiconductor photoelectric conversion device of the present invention. In the illustrated embodiment, parts corresponding to those in FIG. 1 are identified by the same reference numerals and no detailed description will be repeated. The present embodiment is identical in construction with the embodiment of FIG. 1 except that the conductive layer 3 formed on the insulating or semi-insulating layer 2 on the semiconductor layer 1 has a comb- or grid-like pattern, and an anti-reflecting layer 5 is formed on the insulating or semi-insulating layer 2 to cover the conductive layer 3 having the comb- or grid-like pattern.

In this case, the anti-reflecting layer 5 is formed of a light-transparent material and has a thickness determined by the wavelength of the light 6. When light 6 is sunlight, the thickness of the anti-reflecting layer 5 is selected to range from 500 to 800 Å. Such an anti-reflecting layer 5 may be formed as an oxide layer, e.g., silicon oxide, antimony oxide, zirconium oxide or the like but may also be a layer of a silicon nitride. As the nitride, use can also be made of the conductive metal nitride employed for the insulating or semi-insulating layer 2. Also it is possible to employ, as the nitride, a mixture or compound of the silicon nitride and the conductive metal nitride. The anti-reflecting layer 5 can be formed by the known vapor growth method and may also be made multi-layer.

The above is a description of another embodiment of the MIS type semiconductor photoelectric conversion device of the present invention. Since this embodiment is identical in construction with the embodiment of FIG. 1 except in the abovesaid points, no detailed description will be repeated but it has the same advantages as the embodiment of FIG. 1. In addition, the presence of the anti-reflecting layer 5 further enhances the photoelectric conversion efficiency, but in the case where the anti-reflecting layer 5 is made of a nitride, the advantages described previously in connection with FIG. 1 are further promoted.

The foregoing embodiments are merely illustrative of the present invention and should not be construed as limiting the present invention specifically thereto. For example, it is possible to introduce nitrogen into the light-transparent, current-permeable, insulating or semi-insulating layer 2 and the conductive layer 3 and the anti-reflecting layer 5 so as to enhance their chemical stability. Also it is possible to introduce nitrogen into the region of the semiconductor layer 1 on the side of the light-transparent, current-permeable, insulating or semi-insulating layer 2 to obtain a wide to narrow energy band gap structure in which the abovesaid region of the semiconductor layer 1 has a larger energy band gap than the other region of the layer 1, thereby to enable high sensitive photoelectric conversion. Many modifications and variations may be effected without departing from the spirit of the present invention.

What is claimed is:

1. A semiconductor photoelectric conversion device which comprises a semiconductor layer, a conductive layer having a comb- or grid-like pattern formed on the semiconductor layer, and an anti-reflecting layer formed on the semiconductor layer, characterized in that the anti-reflecting layer comprises a conductive metal nitride.

2. A semiconductor photoelectric conversion device according to claim 1 where the anti-reflecting layer further comprises silicon nitride.

3. A semiconductor photoelectric conversion device according to claim 1 wherein a light-transparent, current-permeable, semi-insulating nitride layer is disposed between the semiconductor layer and the conductive layer, the semi-insulating nitride layer being formed of silicon nitride and a conductive metal nitride.

* * * * *